(12) United States Patent
Pauley

(10) Patent No.: US 11,450,372 B2
(45) Date of Patent: *Sep. 20, 2022

(54) PURGEABLE MEMORY MAPPED FILES

(71) Applicant: Apple Inc., Cupertino, CA (US)

(72) Inventor: Mark A. Pauley, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/127,978

(22) Filed: Dec. 18, 2020

(65) Prior Publication Data

US 2021/0110859 A1    Apr. 15, 2021

Related U.S. Application Data

(63) Continuation of application No. 16/522,578, filed on Jul. 25, 2019, now Pat. No. 10,902,903.

(60) Provisional application No. 62/739,153, filed on Sep. 28, 2018.

(51) Int. Cl.
| | |
|---|---|
| *G11C 11/4072* | (2006.01) |
| *G11C 11/409* | (2006.01) |
| *G06F 3/06* | (2006.01) |
| *G06F 12/02* | (2006.01) |

(52) U.S. Cl.
CPC ........ *G11C 11/4072* (2013.01); *G06F 3/0614* (2013.01); *G06F 3/0643* (2013.01); *G06F 3/0679* (2013.01); *G06F 12/0238* (2013.01); *G11C 11/409* (2013.01)

(58) Field of Classification Search
CPC .................................................. G06F 3/0643
USPC ............................................................ 714/16
See application file for complete search history.

(56) References Cited

U.S. PATENT DOCUMENTS

| | | | | |
|---|---|---|---|---|
| 5,913,219 | A * | 6/1999 | Baek | G06F 12/08 |
| 8,392,683 | B1 * | 3/2013 | Confalonieri | G06F 12/0246 |
| | | | | 711/163 |
| 10,902,903 | B2 * | 1/2021 | Pauley | G11C 11/409 |
| 2015/0286695 | A1 | 10/2015 | Kadayam | |
| 2016/0337851 | A1 * | 11/2016 | Yokoyama | G06F 3/1222 |
| 2017/0249333 | A1 * | 8/2017 | Krishnan | G06F 16/185 |
| 2018/0165159 | A1 | 6/2018 | Baker | |
| 2018/0373648 | A1 * | 12/2018 | Barbu | G06F 21/55 |
| 2019/0004894 | A1 | 1/2019 | Chagam | |

* cited by examiner

*Primary Examiner* — Hoai V Ho
(74) *Attorney, Agent, or Firm* — BakerHostetler

(57) ABSTRACT

A device implementing purgeable memory mapped files includes at least one processor configured to receive a first request to store a first data object in volatile memory in association with a copy of the first data object stored in non-volatile memory, the first request indicating to lock the copy in the non-volatile memory. The processor is further configured to provide for storing the first data object in the volatile memory, and lock the copy stored in the non-volatile memory. The processor is further configured to receive a second request associated with clearing a portion of the non-volatile memory, provide an indication that a second data object is available for deletion from the non-volatile memory when the first data object is locked, and provide an indication that the first data object is available for deletion from the non-volatile memory when the first data object has been unlocked.

20 Claims, 4 Drawing Sheets

PURGEABLE MEMORY MAPPED FILES

CROSS-REFERENCE TO RELATED APPLICATIONS

The present application is a continuation of U.S. patent application Ser. No. 16/522,578, entitled "Purgeable Memory Mapped Files," filed Jul. 25, 2019, which claims the benefit of U.S. Provisional Patent Application Ser. No. 62/739,153, entitled "Purgeable Memory Mapped Files," filed Sep. 28, 2018, each of which is hereby incorporated by reference in its entirety for all purposes.

TECHNICAL FIELD

The present description relates generally to storing data objects in memory, including storing a data object in volatile memory in conjunction with backing the data object (e.g., storing a copy of the data object) in non-volatile memory.

BACKGROUND

Volatile memory (such as random access memory (RAM)) may provide faster access times than non-volatile memory (e.g., NVRAM). Thus, an application may request that a data object be stored in volatile memory (e.g., RAM) for fast access. However, RAM may be more costly than NVRAM and therefore an electronic device may typically have less RAM resources available than NVRAM.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
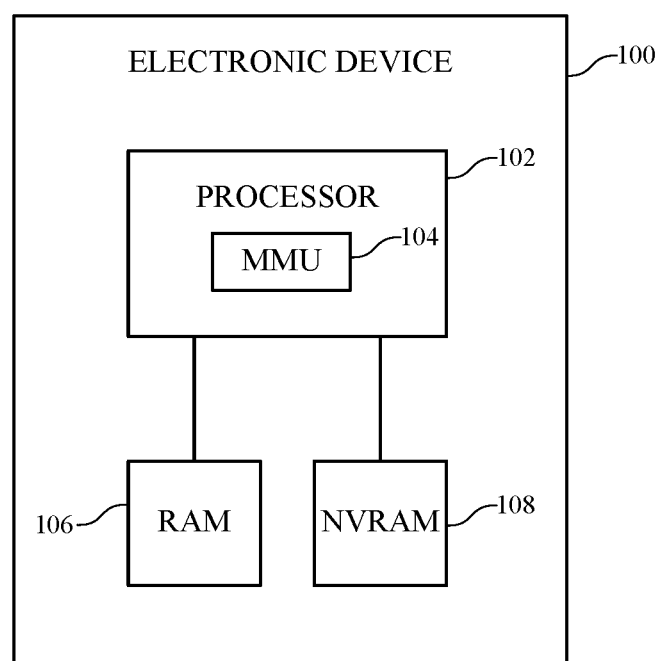
FIG. 1 illustrates an example electronic device that may implement the subject system in accordance with one or more implementations.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

The subject system relates to providing purgeable memory mapped files on a device. In the subject system, a data object is stored in volatile memory (e.g., RAM), with a copy of the data object being stored (or backed) in non-volatile memory (e.g., NVRAM). The data object may be accessed (e.g., by an application) from the volatile memory, which may provide quick access to the data object. If the data object is removed from the RAM, the data object may be reloaded into the RAM from the NVRAM at the next access, which may incur less latency than recreating the data object. However, if the data object is removed from NVRAM, such as by a garbage collection process to free up memory, the data object may need to be recreated by the application at the next access, which may result in additional latency.

In the subject system, an application using a particular data object may request that the copy of the data object stored in the NVRAM be locked, where the lock indicates that the data object is being used by the application and therefore the copy of the data object should be maintained in NVRAM (e.g., in case the data object is removed from RAM). In a case where a portion of NVRAM is to be deleted (e.g., by a garbage collection process to free up memory), the data object is not provided as a candidate for removal from the NVRAM while the data object remains locked. However, when the application unlocks the data object to indicate that the data object is no longer being used by the application, the data object is provided as a candidate for deletion from the NVRAM.

Thus, by allowing applications to indicate when a data object is locked (e.g., in use by the application) or unlocked (e.g., no longer in use by the application), it is possible to identify which data objects should be provided as candidates for removal from the NVRAM without adversely impacting the applications. In this manner, it is not necessary to perform the memory-intensive task of waking up individual application(s) to check if the data object is in use by those applications. Furthermore, by coordinating the memory mapped files being used by the applications with the garbage collection process, the NVRAM and/or the RAM of the device can be used more efficiently while also minimizing the latency incurred by the applications when accessing the data objects.

FIG. 1 illustrates an example electronic device that may implement the subject system in accordance with one or more implementations. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

The electronic device 100 may be, for example, a portable computing device such as a laptop computer, a smartphone, a smart speaker, a peripheral device (e.g., a digital camera, headphones), a tablet device, a wearable device such as a smartwatch, a band, and the like, or any other appropriate device. The electronic device 100 may include a processor 102, and the processor 102 may include a memory management unit (MMU) 104. The electronic device 100 may further include random access memory (RAM) 106 and non-volatile random-access memory (NVRAM) 108.

The processor 102 may include suitable logic, circuitry, and/or code that enable processing data and/or controlling operations of the electronic device 100. In this regard, the processor 102 may be enabled to provide control signals to various other components of the electronic device 100. The processor 102 may also control transfers of data between various portions of the electronic device 100. Additionally, the processor 102 may enable implementation of an operating system or otherwise execute code to manage operations of the electronic device 100.

As described herein, the processor 102 may implement the architecture that provides for the mapping of data objects between virtual memory and physical memory (e.g., the RAM 106), where the data objects in the physical memory may be backed by corresponding files in storage (e.g., the NVRAM 108). In this regard, the MMU 104 of the processor 102 may include suitable logic, circuitry, and/or code that enable the mapping of logical addresses (e.g., in virtual memory, discussed further below with respect to FIG. 2) to physical addresses (e.g., in the RAM 106).

Each of the RAM 106 and the NVRAM 108 may include suitable logic, circuitry, and/or code that enable storage of various types of information such as received data, generated data, code, and/or configuration information. The RAM 106 may correspond to volatile memory, for example, memory that loses its information when power for the electronic device 100 is turned off. While FIG. 1 illustrates the use of RAM as volatile memory, it is possible for the electronic device 100 to use other types of volatile memory instead of or as a supplement to the RAM 106, including but not limited to DRAM, SRAM, T-RAM, Z-RAM, and TTRAM.

On the other hand, the NVRAM 108 may correspond to nonvolatile memory, for example, memory configured to retain its information when power for the electronic device 100 is turned off. While FIG. 1 illustrates the use of NVRAM as nonvolatile memory, it is possible for the electronic device 100 to use other types of nonvolatile memory instead of or as a supplement to the NVRAM 108, including but not limited to flash, nvSRAM, FeRAM, FeTRAM, MRAM, PRAM, CBRAM, SONOS, RRAM, NRAM, racetrack memory, FJG, and Millipede memory.

In general, retrieving data from the RAM 106 may be faster than retrieving the same data from the NVRAM 108. In one or more implementations, a copy of the same data object may be stored in both the RAM 106 and the NVRAM 108. Thus, data object(s) in main memory (e.g., the RAM 106) are backed by storage (e.g., the NVRAM 108). For example, in response to a request by an application for the data object, the processor 102 may retrieve the data object from the RAM 106. In a case where the data object has been removed or is otherwise unavailable in the RAM 106, the processor 102 may retrieve the data object from the NVRAM 108, provide for paging the retrieved data object into the RAM 106, and provide the data object as stored in the RAM 106 in response to the request.

In one or more implementations, one or more of the processor 102, the MMU 104, the RAM 106 and the NVRAM 108, and/or one or more portions thereof, may be implemented in software (e.g., subroutines and code), may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both.

Figure 2:
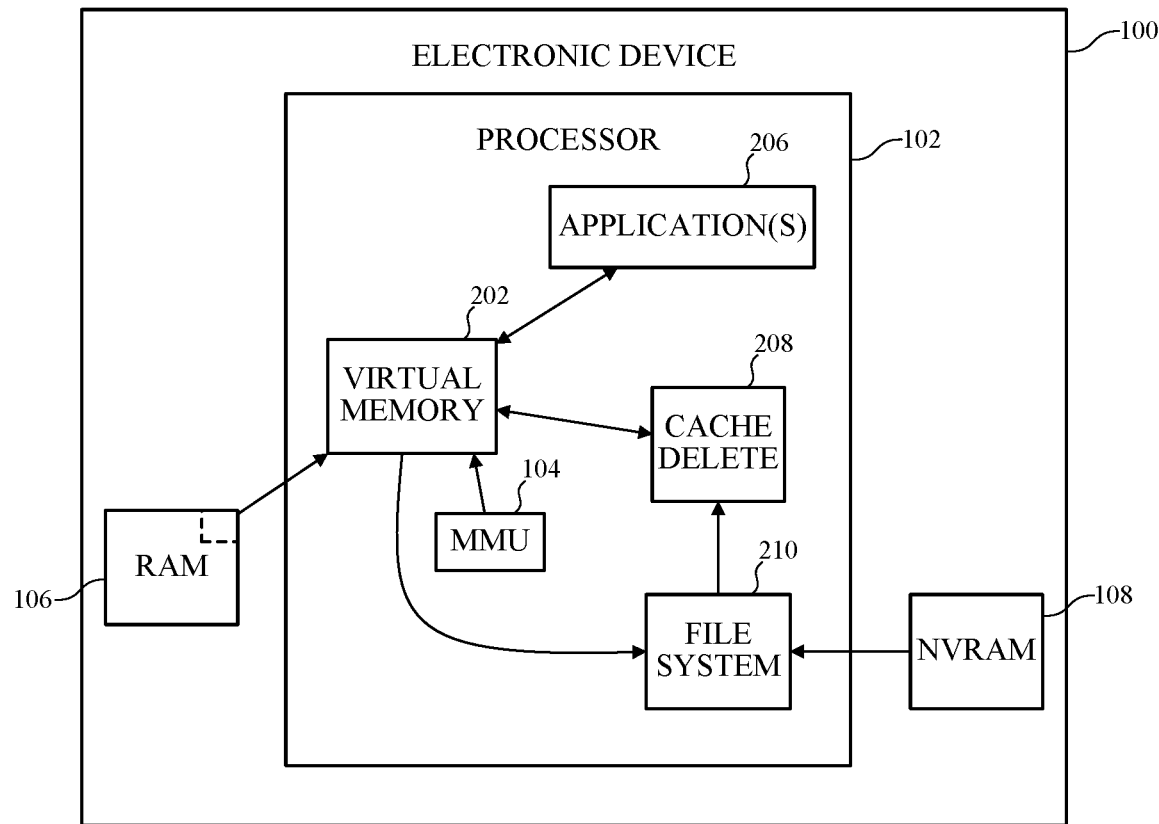
FIG. 2 illustrates an example architecture of logical and physical components that may implement the subject system in accordance with one or more implementations.

FIG. 2 illustrates an example architecture of logical and physical components that may implement the subject system on the electronic device 100 in accordance with one or more implementations. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

As noted above, the electronic device 100 may include one or more physical components such as the processor 102, the MMU 104, the RAM 106 and the NVRAM 108. Moreover, as shown in FIG. 2, the processor 102 may implement one or more logical components, such as by executing code corresponding to an operating system. The one or more logical components may include, for example, a virtual memory 202, one or more application(s) 206 (e.g., corresponding to client(s)), a cache delete 208 and a file system 210.

In one or more implementations, the application(s) 206 may correspond to one or more of: application(s) executing in kernel space of the electronic device 100, application(s) executing in user space of the electronic device 100, applications executing in a sandboxed process, separate application(s) that are distinct from each other, and/or application(s) that perform in conjunction with one another (e.g., to perform specific task(s)).

In general, the application(s) 206 may create and/or otherwise obtain data for storing (e.g., caching) in the RAM 106. For example, the application(s) 206 may have performed processing on a first file (e.g., an image file) in order to create a second file (e.g., a corresponding thumbnail image). In order to avoid or reduce having to recreate the thumbnail every time the thumbnail is needed, the application(s) 206 may instruct the virtual memory 202 to save the thumbnail in memory (e.g., in the RAM 106). In this regard, the time required to retrieve the data object from the RAM 106 is typically faster than the processing time required to recreate the data object from the first file.

However, the RAM 106 typically has smaller capacity than the NVRAM 108, such as when the electronic device 100 is a mobile device such as a smartphone, smartwatch or the like. As such, the virtual memory 202 may remove data objects stored in the RAM 106 in instances where the amount of available storage in the RAM 106 is low (e.g., below a threshold and/or insufficient to perform a current operation requested by the operating system). When the cached data objects are deleted from the RAM 106, the application(s) 206 may be required to recreate the data objects, which may slow down system performance for the electronic device 100.

The virtual memory 202 is a logical component accessible by a kernel of an operating system running on the electronic device 100. In general, the virtual memory 202 simulates additional main memory (e.g., the RAM 106) by utilizing nonvolatile memory (e.g., the NVRAM 108) as temporary storage. In doing so, the virtual memory 202 may utilize the MMU 104, which is configured to correlate addresses in the virtual memory 202 with physical addresses in the RAM 106. The virtual memory may further utilize the file system 210, which is a logical component for storing and retrieving data from the NVRAM 108. Since the NVRAM 108 typically has larger storage capacity than the RAM 106, the use of virtual memory 202 simulates a larger amount of main memory that is available running on the electronic device 100.

As part of the process of correlating virtual memory addresses (e.g., in the virtual memory 202) with physical memory addresses (e.g., in the RAM 106), the operating system of the electronic device 100 may divide the RAM 106 into page files, for example, that include a fixed number of addresses.

The electronic device 100 may further use memory mapping of data objects, such that a data object created and/or used by the application(s) 206 is stored in the RAM 106 with a backup copy filed in the NVRAM 108. The application(s) may request a data object from the virtual memory 202 and in response, the virtual memory 202 may retrieve the data object from the RAM 106. If the data object has been removed from the RAM 106, the virtual memory may retrieve the backup copy from the NVRAM 108, and reload that data object into the RAM 106 for providing to the application(s) 206.

The electronic device 100 may further include a cache delete 208. In general, the cache delete 208 provides for deleting portions of the NVRAM 208 as storage is needed. In response to a request to free up memory in the NVRAM 108, the cache delete 208 provides for removing data objects (e.g., files) from the NVRAM 108 as a background process (e.g., a garbage collection process), without necessarily having to interact with other processes (e.g., application(s) 206) running on the electronic device 100. As noted above, waking up an application may increase memory pressure for the electronic device 100. For example, waking up an application typically requires that code memory for that application to be paged into the RAM 106. By virtue of the cache delete 208, it is possible to clear memory in the NVRAM 108 without having to wake up applications (e.g., application(s) 206) or otherwise interact with the client system of the electronic device 100.

There are different scenarios in which the cache delete 208 may initiate clearing up portions of the NVRAM 108. For example, a user of the electronic device 100 may have requested to download an application for storage in the NVRAM 108, and the file system 210 may indicate that an amount of available storage capacity in the NVRAM 108 is insufficient or below a predefined value with respect to the download. In another example, the user of the electronic device may have taken pictures and/or otherwise provided content for storage in the NVRAM 108, and the file system 210 may indicate that the amount of available storage is insufficient and/or below a predefined value. In response, the cache delete 208 would clear sufficient portions of the NVRAM 108 (e.g., by purging one or more data objects therein).

Another example of clearing portions of the NVRAM 108 relates to periodic maintenance associated with the cache delete 208. For example, the cache delete 208 may perform such maintenance on a periodic basis (e.g., once per day) upon detection of certain events (e.g., the electronic device 100 being plugged in). In this regard, the maintenance may be implemented as part of a garbage collection component of the electronic device 100. Thus, the cache delete 208 would clear the appropriate portions of the NVRAM 108 (e.g., by purging one or more data objects therein).

In another example, if a particular application (e.g., the application(s) 206) crashes, it may be appropriate to clear the data objects associated with that application from the NVRAM 108. Thus, in detecting that the application crashed, the operating system may notify the virtual memory 202 to purge all data objects associated with the application from the NVRAM 108. The virtual memory 202 would then notify the cache delete 208, which would clear the appropriate portions of (e.g., purging the data objects from) the NVRAM 108.

However, in some cases, it is possible that a data object in the NVRAM 108 is still being used by one or more applications (e.g., the application(s) 206). By deleting the copy of the data object in the NVRAM 108, the backup copy of the data object would no longer be available. If the data object were removed from the RAM 106 with no backup, a fault may occur when the data object is requested by the application(s) 206, and the data object may then need to be recreated by the application(s) 206.

Thus, the electronic device 100 provides for applications (e.g., the application(s) 206) to request that purgeable memory mapped data object(s) stored in the NVRAM 108 be locked. More specifically, after creating or obtaining a data object, the application(s) 206 may request the virtual memory 202 to store the data object. The request may include an indication to lock the data object (e.g., in the NVRAM 108). In one or more implementations, the indication to lock the data object may be separate from the request. The lock may indicate that the data object is in use. In response to the request (and indication to lock the data object), the virtual memory 202 would store the data object in the RAM 106 and the NVRAM 108. The virtual memory 202 may also store an indication to lock the copy of the data object in the NVRAM 108 (e.g., based on the request, the indication to lock the data object and/or whether the copy of the data object is currently stored in the NVRAM 108).

The indication to lock the copy of the data object may be implemented by the virtual memory 202 using respective lock counts for data objects stored in the NVRAM 108. Thus, for each memory mapped data object stored in the NVRAM 108, the respective lock count (e.g., as set by a counter implemented by the virtual memory 202) may indicate a total number of applications with a lock on the data object.

For example, a first application may have created a data object, requested to lock the data object, and passed the data object to a second application (e.g., via a pointer or reference to the data object). In turn, the second application may have requested to lock the data object. In this example, the lock count for the data object would be 2, since 2 applications are using the data object. Thus, the lock count maintained by the virtual memory 202 (e.g., via the counter) may indicate the number of applications that use (and thereby reference) the data object. In one or more implementations, a lock count of 0 would indicate that the data object is not in use by any application.

As applications (e.g., the application(s) 206) respectively determine that they no longer need to use the data object, the application(s) may provide an indication to the virtual memory 202, to unlock the data object stored in the NVRAM 108. In response to the unlock request, the virtual memory 202 may (e.g., using the counter) decrement the lock count for that data object on a per-application basis.

With respect to the cache delete 208, data objects that are locked (e.g., data objects with a lock count greater than 0) would not be provided as candidates for removal. Instead, the cache delete 208 would consider data object(s) (e.g., purgeable data objects) that are not locked as potential candidates for removal. Alternatively, in one or more implementations, it is possible that all current data objects are locked (e.g., each data object has a lock count greater than 0). In such cases, the cache delete 208 may consider data object(s) that with the lowest lock count(s) as potential candidates for removal. As noted above, in a case where the application(s) 206 subsequently require use of the of a removed data object, the application(s) 206 may recreate the data object, and request the virtual memory 202 to again store and lock the data object (e.g., in the NVRAM 108).

Thus, as described herein, locking a data object may indicate that the data object is being used by the application(s) 206 and therefore the copy of the data object is to be maintained in NVRAM 108 (e.g., in case the data object is removed from RAM 106). Alternatively or in addition, locking a data object may correspond with prioritizing to maintain and/or preventing from deleting the data object.

As noted above, while FIGS. 1-2 illustrate the use of RAM 106 as volatile memory, it is possible for the electronic device 100 to use other types of volatile memory instead of or as a supplement to the RAM 106, including but not limited to DRAM, SRAM, T-RAM, Z-RAM, and TTRAM. In addition, while FIGS. 1-2 illustrate the use of NVRAM as nonvolatile memory, it is possible for the electronic device 100 to use other types of nonvolatile memory instead of or as a supplement to the NVRAM 108, including but not limited to flash, nvSRAM, FeRAM, FeTRAM, MRAM, PRAM, CBRAM, SONOS, RRAM, NRAM, racetrack memory, FJG, and Millipede memory.

Moreover, it is possible for the electronic device 100 to use two different types of volatile memory (e.g., a first type of volatile memory and a second type of volatile memory) instead of using a volatile memory (e.g., the RAM 106) and a non-volatile memory (e.g., the NVRAM 108). In other words, a first type of volatile memory (e.g., the RAM 106) may be used as described herein, while a second type of volatile memory (not shown) may be used in lieu of the non-volatile memory (e.g., the NVRAM 108) described herein. For example, one type of volatile memory may be more expensive than the other causing there to be less of that type (e.g., dynamic vs. static volatile memory). Thus, the subject system may work with different types of memory (e.g., volatile vs. non-volatile memory, dynamic volatile memory vs. static volatile memory, or other different types of memory).

In one or more implementations, one or more of the processor 102, the MMU 104, the RAM 106, the NVRAM 108, the virtual memory 202, the application(s) 206, the cache delete 208, the file system 210, and/or one or more portions thereof, may be implemented in software (e.g., subroutines and code), may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both.

Figure 3:
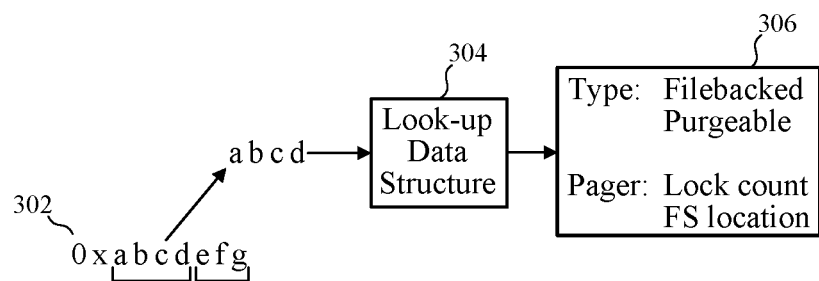
FIG. 3 illustrates an example of obtaining a purgeable memory mapped data object from nonvolatile memory in accordance with one or more implementations.

FIG. 3 illustrates an example of obtaining a purgeable memory mapped data object from nonvolatile memory in accordance with one or more implementations. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

FIG. 3 illustrates a virtual memory address 302 for a data object, a look-up data structure 304 for looking up the data object corresponding to the virtual memory address 302, and a data record 306 associated with accessing the data object from physical memory. For example, the virtual memory 202 may provide the application(s) 206 with the virtual memory address 302 for the data object when the data object is stored, and the application(s) 206 may provide the virtual memory address 302 to the virtual memory 202 as part of a request for the data object. In one or more implementations, the virtual memory address 302 is a hexadecimal number (e.g., 0xabcdefg). The first 4 hexadecimal characters (e.g., "abcd") may correspond to an index into a page in memory, and the remaining hexadecimal characters (e.g., "efg") may correspond to a page number. In the example of FIG. 3, there are 12 bits since there are 4 bits per hexadecimal character. Moreover, there may be 4 kb per page.

The virtual memory 202, in conjunction with the MMU 104, is configured to determine the physical address in RAM 106 that corresponds to the virtual memory address 302, and to provide the data object to the application(s) 206 based on the physical address in RAM 106. However, in some cases, the data object may no longer be available in the RAM 106, for example, due to deletion of the data object from the RAM 106. In such cases, the virtual memory 202 may retrieve the data object from the NVRAM 108 for reloading into the RAM 106.

Thus, the look-up data structure 304 may provide for looking up and obtaining the data record 306 for the virtual memory address 302, where the data record 306 may include information for the location of the data object in the NVRAM 108. In one or more implementations, the look-up data structure 304 may be implemented as a tree, which may be traversed in order to arrive at a node corresponding to the first 4 hexadecimal characters (e.g., "abcd") of the virtual memory address 302. The node may include the data record 306. It should be noted that the look-up data structure 304 is not limited to a tree, and may be implemented as any data structure for looking up one or more portions of the virtual memory address 302 (e.g., the first 4 hexadecimal characters of "abcd").

The data record 306 may include multiple fields, including a type of the data object and pager information associated with the virtual memory address 302. In the example of FIG. 3, the type of the data object is a purgeable memory mapped file. The pager information indicates a lock count together with the file system ("FS") location of the data object (e.g., corresponding to the NVRAM 108). As noted above, the lock count indicates the number of applications that have an active lock on (e.g., are still using) the data object. If the lock count is set to 0, for example, this may be an indication to the cache delete 208 that the data object is a candidate for deletion.

Based on the FS location, the virtual memory 202 may determine the location of the data object in the NVRAM 108. In conjunction with the file system 210, the virtual memory 202 may access data object in the NVRAM 108 based on an address corresponding to the FS location. The virtual memory 202 can load the data object into the RAM 106, for providing to the application(s) 206. In doing so, the MMU 104 may correlate the address in physical memory (e.g., a page location in the RAM 106) with the address in the virtual memory 202.

In one or more implementations, it is possible that the data object is not available (e.g., has been deleted) in the NVRAM 108. In such a case, the node corresponding to the data record 306 as provided by the look-up data structure 304 may be null, or the data record 306 may have one or more null fields indicating that the data object is not available in the NVRAM 108. Based on this indication, the virtual memory 202 may notify the application(s) 206 that the data object is not available, and the application(s) 206 may respond accordingly. For example, since the data object is not provided to the virtual memory 202, the application(s) 206 may recreate the data object on its end (e.g., recreating a thumbnail file), and request the virtual memory 202 to save the recreated data object in memory as a purgeable memory mapped file together with a request to lock the data object.

In one or more implementations, one or more of the look-up data structure 304, together with its corresponding data records (e.g., data record 306), and/or one or more portions thereof, may be implemented in software (e.g., subroutines and code), may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both.

Figure 4:
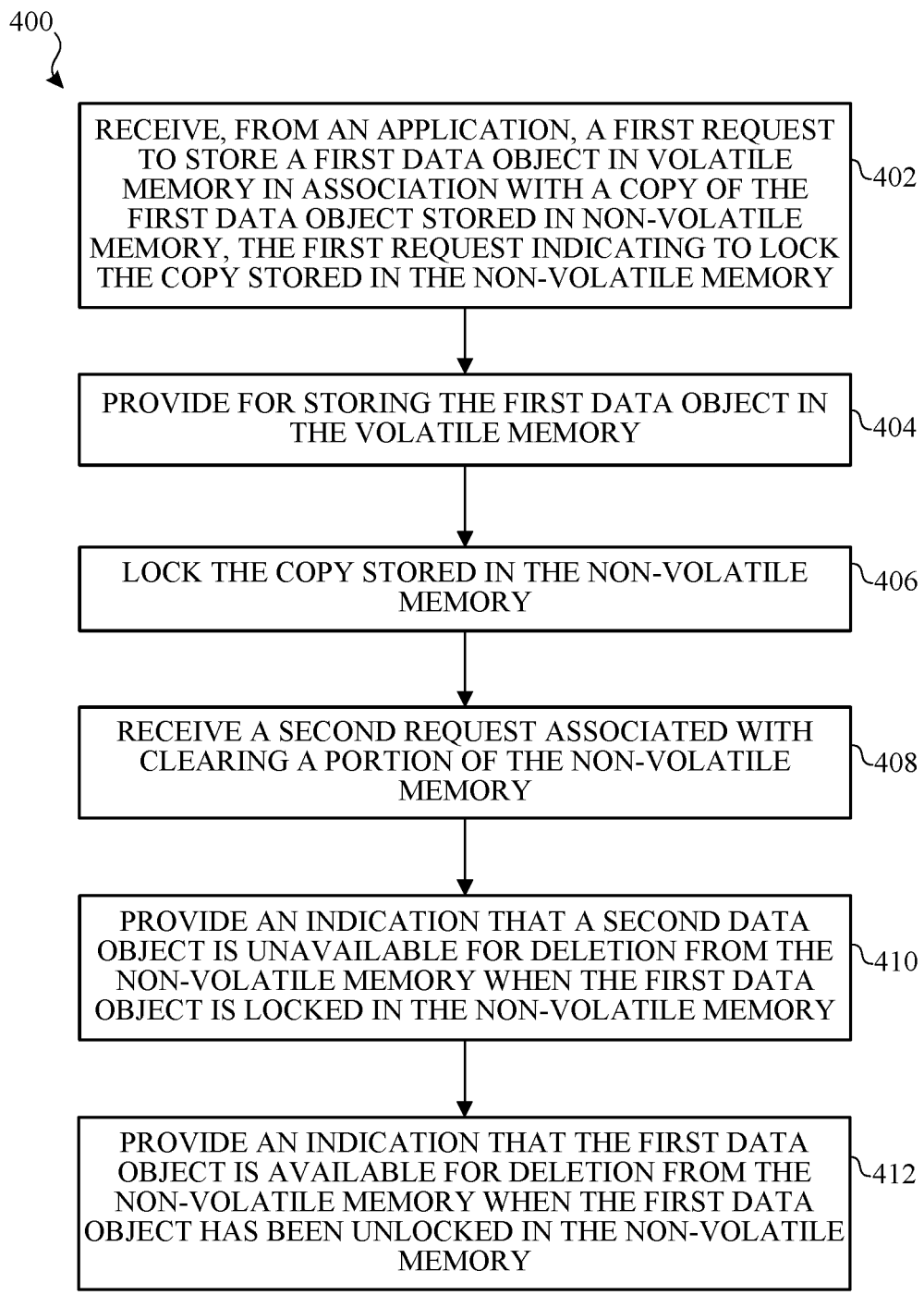
FIG. 4 illustrates a flow diagram of an example process for creating a purgeable memory mapped file in accordance with one or more implementations.

FIG. 4 illustrates a flow diagram of an example process for creating a purgeable memory mapped file in accordance with one or more implementations. For explanatory purposes, the process 400 is primarily described herein with reference to the electronic device 100 of FIGS. 1 and 2. However, the process 400 is not limited to the electronic device 100, and one or more blocks (or operations) of the process 400 may be performed by one or more other components of the electronic device 100 and/or by other suitable devices. Further for explanatory purposes, the blocks of the process 400 are described herein as occurring in serial, or linearly. However, multiple blocks of the process 400 may occur in parallel. In addition, the blocks of the process 400 need not be performed in the order shown and/or one or more blocks of the process 400 need not be performed and/or can be replaced by other operations.

The virtual memory 202 receives, from the application(s) 206 (e.g., an application) a first request to store a first data object in the RAM 106 (e.g., volatile memory) in association with storing a copy of the first data object in the NVRAM 108 (e.g., non-volatile memory), the first request indicating to lock the copy stored in the NVRAM 108 (402). Locking the copy may include storing an indication to lock the copy in the NVRAM 108.

The copy of the first data object may be stored in the NVRAM 108 prior to receiving the first request. Alternatively or in addition, the copy of the first data object may not be stored in the NVRAM 108 prior to receiving the first request. Thus, responsive to receiving the first request, the virtual memory 202 may provide for storing the copy in the NVRAM 108.

Responsive to receiving the first request, the virtual memory 202 provides for storing the first data object in the RAM 106 (404), and for locking the copy stored in the NVRAM 108 (406). The virtual memory 202 receives a second request associated with clearing a portion of the NVRAM 108 (408).

The second request may be associated with an amount of space remaining in the NVRAM 108. For example, the second request may be a request (e.g., from the cache delete 208) for freeing up memory, storing data in the portion of the NVRAM 108, and/or releasing memory held by an application that has terminated.

Responsive to receiving the second request, the virtual memory 202 provides an indication that a second data object (e.g., different from the first data object) is available for deletion from the NVRAM 108 when the first data object is locked in the NVRAM 108 (410). The virtual memory 202 provides an indication that the first data object is available for deletion from the NVRAM 108 when the first data object has been unlocked in the NVRAM 108 (412).

The virtual memory 202 may receive, from the application(s) 206, a third request to retrieve the first data object. Responsive to receiving the third request, the virtual memory 202 may retrieve, in accordance with a determination that the first data object is stored in the RAM 106, the first data object from the RAM 106. In accordance with a determination that the first data object is not included in the RAM 106, the virtual memory 202 may retrieve the first data object from the NVRAM 108. In a case where the first data object is also not in the NVRAM 108, the virtual memory 202 may provide, to the application(s) 206, an indication that the first data object is not available.

Figure 5:
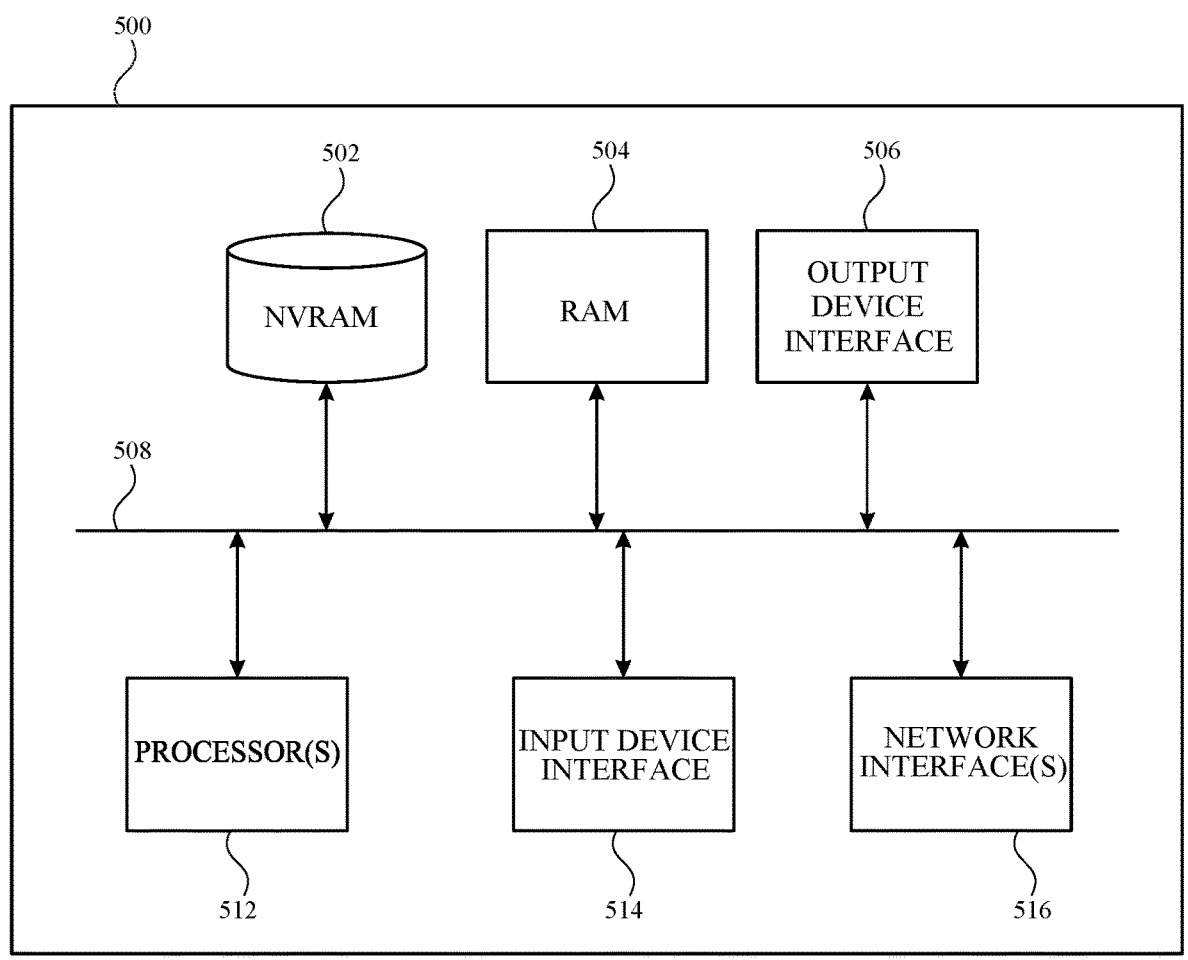
FIG. 5 illustrates an example electronic system with which aspects of the subject technology may be implemented in accordance with one or more implementations.

FIG. 5 illustrates an electronic system 500 with which one or more implementations of the subject technology may be implemented. The electronic system 500 can be, and/or can be a part of, the electronic device 100. The electronic system 500 may include various types of computer readable media and interfaces for various other types of computer readable media. The electronic system 500 includes a bus 508, one or more processing unit(s) 512, a RAM 504 (e.g., corresponding to system memory and/or buffer), an NVRAM 502 (e.g., corresponding to storage), an input device interface 514, an output device interface 506, and one or more network interfaces 516, or subsets and variations thereof.

The bus 508 collectively represents all system, peripheral, and chipset buses that communicatively connect the numerous internal devices of the electronic system 500. In one or more implementations, the bus 508 communicatively connects the one or more processing unit(s) 512 with the RAM 504, and the NVRAM 502. From these various memory units, the one or more processing unit(s) 512 retrieves instructions to execute and data to process in order to execute the processes of the subject disclosure. The one or more processing unit(s) 512 can be a single processor or a multi-core processor in different implementations.

The NVRAM 502 may be a read-and-write memory device. The NVRAM 502 may be a non-volatile memory unit that stores instructions and data even when the electronic system 500 is off. In one or more implementations, a mass-storage device (such as a magnetic or optical disk and its corresponding disk drive) may be used as the NVRAM 502. In one or more implementations, a removable storage device (such as a floppy disk, flash drive, and its corresponding disk drive) may be used as the NVRAM 502.

Like the NVRAM 502, the RAM 504 may be a read-and-write memory device. However, unlike the NVRAM 502, the RAM 504 may be a volatile read-and-write memory. The RAM 504 may store any of the instructions and data that one or more processing unit(s) 512 may need at runtime. In one or more implementations, the processes of the subject disclosure are stored in the RAM 504 and/or the NVRAM 502. From these various memory units, the one or more processing unit(s) 512 retrieves instructions to execute and data to process in order to execute the processes of one or more implementations.

The bus 508 also connects to the input and output device interfaces 514 and 506. The input device interface 514 enables a user to communicate information and select commands to the electronic system 500. Input devices that may be used with the input device interface 514 may include, for example, alphanumeric keyboards and pointing devices (also called "cursor control devices"). The output device interface 506 may enable, for example, the display of images generated by electronic system 500. Output devices that may be used with the output device interface 506 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 5, the bus 508 also couples the electronic system 500 to one or more networks and/or to one or more network nodes, through the one or more network interface(s) 516. In this manner, the electronic system 500 can be a part of a network of computers (such as a LAN, a wide area network ("WAN"), or an Intranet, or a network of networks, such as the Internet. Any or all components of the electronic system 500 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method, comprising:
    responsive to a request from an application:
        providing for storing a first data object in volatile memory in association with a copy of the first data object stored in non-volatile memory, and
        locking the copy stored in the non-volatile memory.

2. The method of claim 1, wherein the copy of the first data object is stored in the non-volatile memory prior to receiving the request.

3. The method of claim 2, wherein the request comprises a request to store the first data object in the volatile memory based on the copy of the first data object previously stored in the non-volatile memory.

4. The method of claim 1, wherein the copy of the first data object is not stored in the non-volatile memory prior to receiving the request.

5. The method of claim 4, further comprising providing for storing the copy in the non-volatile memory responsive to receiving the request.

6. The method of claim 1, further comprising receiving, from the application, an additional request to retrieve the first data object; and
    determining whether first data object is stored in the volatile memory.

7. The method of claim 6, further comprising, retrieving, in accordance with a determination that the first data object is stored in the volatile memory, the first data object from the volatile memory.

8. The method of claim 6, further comprising retrieving, in accordance with a determination that the first data object is not included in the volatile memory, the first data object from the non-volatile memory.

9. A method, comprising:
    receiving a request associated with clearing a portion of a non-volatile memory storing a locked copy of a first data object that is associated with a copy of the first data object that is stored in a volatile memory; and
    responsive to the request, providing an indication that a second data object is available for deletion from the non-volatile memory.

10. The method of claim 9, wherein the request is associated with an amount of space remaining in the non-volatile memory.

11. The method of claim 9, wherein the request is a request for at least one of freeing up memory, storing data in the portion of the non-volatile memory, or releasing memory held by an application that has terminated.

12. The method of claim 9, further comprising locking the copy of the first data object by storing an indication to lock the copy in the non-volatile memory.

13. The method of claim 9, further comprising:
    determining that the first data object has been removed from the volatile memory; and
    storing a new copy of the first data object in the volatile memory using the locked copy of the first data object stored in the non-volatile memory.

14. The method of claim 13, further comprising, prior to determining that the first data object has been removed from the volatile memory, generating the first data object by an application.

15. The method of claim 14, further comprising locking the copy of the first data object that is stored in the non-volatile memory responsive to a request from the application.

16. A device, comprising:
    volatile memory;
    non-volatile memory; and
    at least one processor configured to, responsive to a request from an application:
        provide for storing a first data object in the volatile memory in association with a copy of the first data object stored in the non-volatile memory, and
        lock the copy stored in the non-volatile memory.

17. The device of claim 16, wherein the copy of the first data object is stored in the non-volatile memory prior to receiving the request.

18. The device of claim 17, wherein the request comprises a request to store the first data object in the volatile memory based on the copy of the first data object previously stored in the non-volatile memory.

19. The device of claim 16, wherein the copy of the first data object is not stored in the non-volatile memory prior to receiving the request.

20. The device of claim 19, further comprising providing for storing the copy in the non-volatile memory responsive to receiving the request.

\* \* \* \* \*